ns(12) United States Patent
Cheng et al.

(10) Patent No.: US 8,932,918 B2
(45) Date of Patent: Jan. 13, 2015

(54) FINFET WITH SELF-ALIGNED PUNCHTHROUGH STOPPER (75) Inventors: Kangguo Cheng, Schenectady, NY (US); Balasubramanian S. Haran, Watervliet, NY (US); Shom Ponoth, Clifton Park, NY (US); Theodorus E. Standaert, Clifton Park, NY (US); Tenko Yamashita, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 87 days.

(21) Appl. No.: 13/598,080

(22) Filed: Aug. 29, 2012

(65) Prior Publication Data
US 2014/0061794 A1 Mar. 6, 2014

(51) Int. Cl.
H01L 21/338 (2006.01)
(52) U.S. Cl.
USPC .............. 438/173; 438/311; 257/347
(58) Field of Classification Search
CPC ............ H01L 21/823821; H01L 27/1211; H01L 29/785; H01L 29/1079; H01L 29/7851; H01L 29/7856; H01L 29/78609; H01L 29/66795; H01L 29/7848; H01L 29/78; H01L 29/165; H01L 27/1203; H01L 21/845; H01L 29/1054
USPC ............. 257/347, E27.112, E21.09; 438/311, 438/173
See application file for complete search history.

(56) References Cited

U.S. PATENT DOCUMENTS

| | | | |
|---|---|---|---|
| 7,728,324 | B2 | 6/2010 | Tezuka et al. |
| 7,868,395 | B2 | 1/2011 | Watanabe et al. |
| 8,134,209 | B2 | 3/2012 | Yagishita et al. |
| 2008/0061370 | A1 | 3/2008 | Matsuo |
| 2008/0173934 | A1 | 7/2008 | Lee et al. |
| 2009/0267155 | A1 | 10/2009 | Izumida et al. |
| 2009/0278196 | A1 | 11/2009 | Chang et al. |
| 2010/0072550 | A1 | 3/2010 | Matsuo |
| 2010/0144121 | A1 | 6/2010 | Chang et al. |
| 2010/0163971 | A1* | 7/2010 | Hung et al. ............ 257/327 |
| 2010/0213548 | A1 | 8/2010 | Chang et al. |
| 2011/0042744 | A1* | 2/2011 | Cheng et al. ............ 257/347 |
| 2011/0121404 | A1 | 5/2011 | Shifren et al. |
| 2011/0169101 | A1 | 7/2011 | Doornbos et al. |

FOREIGN PATENT DOCUMENTS

KR 1020000056248 A 9/2000

OTHER PUBLICATIONS

Chin et al. "III-V Multiple-Gate Field-Effect Transistors With High-Mobility In0.7Ga0.3As Channel and Epi-Controlled Retrograde-Doped Fin", IEEE Electron Device Letters, vol. 32, No. 2, 2011, 3 pages.
Song et al. "Fin and Recess Channel MOSFET (FIReFET) for Performance Enhancement of Sub-50 nm DRAM Cell", ISDRS 2007 IEEE, http://www.ece.umd.edu/ISDRS, 2 pages.
PCT Application No. PCT/US2013/050020 Filed: Jul. 11, 2013 PCT International Search Report and Written Opinion.

* cited by examiner

*Primary Examiner* — Khiem D Nguyen
(74) *Attorney, Agent, or Firm* — Yuanmin Cai; Roberts Mlotkowski Safran & Cole, P.C.

(57) ABSTRACT

A finFET with self-aligned punchthrough stopper and methods of manufacture are disclosed. The method includes forming spacers on sidewalls of a gate structure and fin structures of a finFET device. The method further includes forming a punchthrough stopper on exposed sidewalls of the fin structures, below the spacers. The method further includes diffusing dopants from the punchthrough stopper into the fin structures. The method further includes forming source and drain regions adjacent to the gate structure and fin structures.

20 Claims, 6 Drawing Sheets

FINFET WITH SELF-ALIGNED PUNCHTHROUGH STOPPER

FIELD OF THE INVENTION

The invention relates to semiconductor structures and methods of manufacture and, more particularly, to finFETs with a self-aligned punchthrough stopper and methods of manufacture.

BACKGROUND

FinFET devices can be fabricated for complementary metal-oxide-semiconductor (CMOS) technologies, particularly at the 22 nm node and beyond. FinFET devices can be used in a variety of applications such as microprocessors, microcontrollers, and other digital logic circuits. A finFET can be fabricated on either BULK or SOI substrates. In either fabrication scheme, a characteristic of the finFET is the conducting channel being wrapped by a thin silicon "fin". The thickness of the fin (measured in the direction from source to drain) determines the effective channel length of the device.

SUMMARY

In a first aspect of the invention, a method comprises forming spacers on sidewalls of a gate structure and fin structures of a finFET device. The method further comprises forming a punchthrough stopper on exposed sidewalls of the fin structures, below the spacers. The method further comprises diffusing dopants from the punchthrough stopper into the fin structures. The method further comprises forming source and drain regions adjacent to the gate structure and fin structures.

In another aspect of the invention, a method comprises forming fin structures from at least a BULK substrate. The method further comprises forming a gate structure on the fin structures and the BULK substrate. The method further comprises forming shallow trench isolation structures on sidewalls of the fin structures and surfaces of the BULK substrate. The method further comprises forming sidewall spacers on the sidewalls of the fin structures and sidewalls of the gate structure. The method further comprises recessing the shallow trench isolation structures to exposed sidewalls of the fin structures, below the sidewall spacers. The method further comprises forming punchthrough stoppers on the exposed sidewalls of the fin structures and the shallow trench isolation structures, diffusing dopants of the punchthrough stoppers into the fin structures. The method further comprises forming source and drain regions over the punchthrough stoppers.

In yet another aspect of the invention, a structure comprises a set of fins and a gate structure directly on the set of fins. The structure further comprises a punchthrough stopper material on sidewalls of the set of fins. A dopant of the punchthrough stopper material is under the set of fins. The structure further comprises source and drain material directly on the punchthrough stopper material and adjacent to the gate and set of fins.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of the semiconductor structures, which comprises the structures of the present invention. In still further embodiments, a method in a computer-aided design system is provided for generating a functional design model of the semiconductor structures. The method comprises generating a functional representation of the structural elements of the semiconductor structures.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

FIGS. 1-9c show structures and respective processing steps in accordance with aspects of the present invention.

DETAILED DESCRIPTION

The invention relates to semiconductor structures and methods of manufacture and, more particularly, to a finFET with self-aligned punchthrough stopper and methods of manufacture. In embodiments, the method of fabricating the finFET will advantageously reduce parasitic capacitance of the device as well as reduce device variability. As to these advantages, the fabrication processes of the present invention eliminate the need to implant dopants from a top side of the device. Instead, the methods of the present invention utilize a punchthrough stopper (e.g., epitaxial layer) with in-situ doping. In embodiments, the punchthrough stopper can be a stress material, to improve device performance. A source and drain layer can also be formed utilizing an epitaxial layer of stress material. Accordingly, the methods of the present invention will improve device performance by permitting integration of stress materials within the channel of the device.

In embodiments, the finFET device can be formed on a BULK substrate, thereby forming a BULK finFET device. In addition, the finFET device of the present invention can be utilized in a gate-first or gate-last fabrication process. For example, the BULK finFET device can be fabricated using replacement gate process in which a dummy gate is first formed and then later replaced by a real gate.

Figure 1:
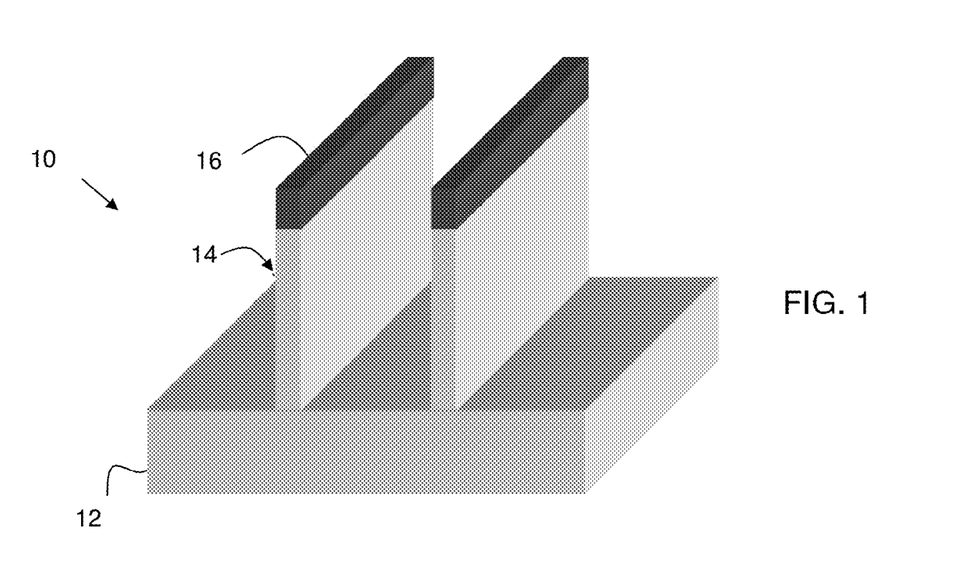

FIG. 1 shows a structure and respective processing steps in accordance with aspects of the present invention. In particular, the structure 10 includes a BULK wafer 12. In embodiments, the BULK wafer 12 comprises a Si substrate; although other bulk semiconductor materials such as germanium, silicon germanium, compound semiconductors (III-V or II-VI compound semiconductors) are also contemplated by the present invention. A hardmask material 16 can be deposited on the wafer 12. In embodiments, the hardmask 16 can be a nitride material, formed using conventional deposition processes, e.g., chemical vapor deposition (CVD) processes.

A plurality of fins 14 are formed from the BULK wafer 12 and hardmask material 16. In embodiments, the plurality of fins 14 can be formed using conventional deposition, lithography and etching processes, e.g., sidewall imaging transfer techniques. In more specific embodiments, an amorphous Si material is formed on the hardmask 16, and conventionally patterned to form a mandrel. The patterning of the Si material can be achieved using any conventional lithography and etching (reactive ion etching) processes, known to accomplish such patterning techniques. After patterning, sidewall spacers are formed on both sides of the mandrel. The mandrel can then be removed, leaving the two sidewall spacers. The sidewalls spacers, in turn, can be used to pattern the fins 14. In embodiments, the fins 14 can have a width of about 5 nm to about 20 nm, a height of about 40 nm to about 150 nm and a pitch therebetween of about 20 nm to about 100 nm; although other dimensions are also contemplated by the present invention.

Figure 2:
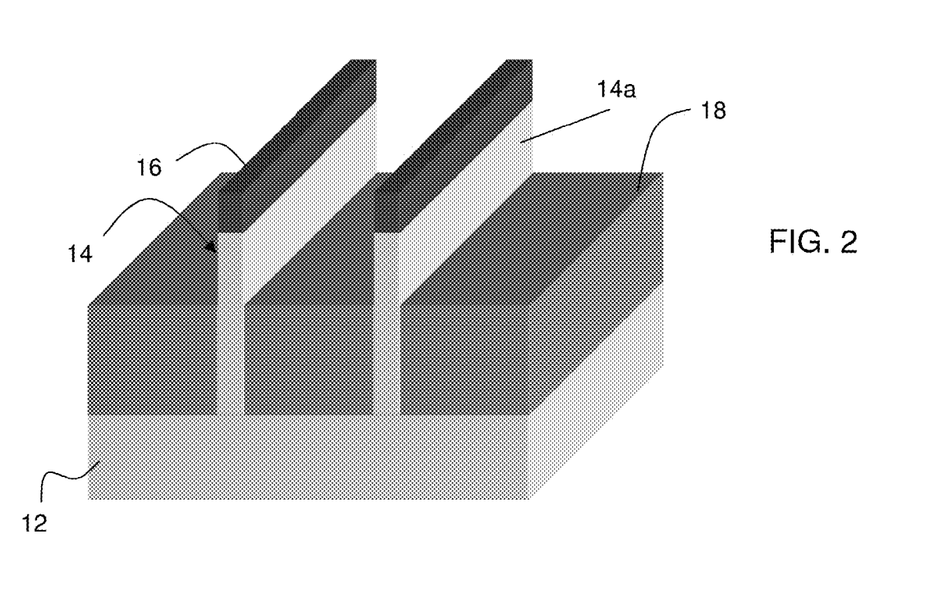

In FIG. 2, shallow trench isolation (STI) regions 18 are formed on the sides of the fins 14. In embodiments, the STI regions 18 can be formed using a conventional CVD or spin on process, on the substrate 12. The STI regions 18 can be formed from oxide or other insulator material. In more specific embodiments, the STI regions 18 can be formed by depositing an oxide material over the fins 14, and planarizing the oxide material to the hardmask material 16 using a conventional chemical mechanical polishing (CMP) process. The oxide material can then be etched to form a recessed portion, exposing a portion of the sidewalls 14a of the fins 14. In embodiments, the sidewalls 14a can be exposed to a height of about 15 nm to about 30 nm; although other dimensions are also contemplated by the present invention.

Figure 3:
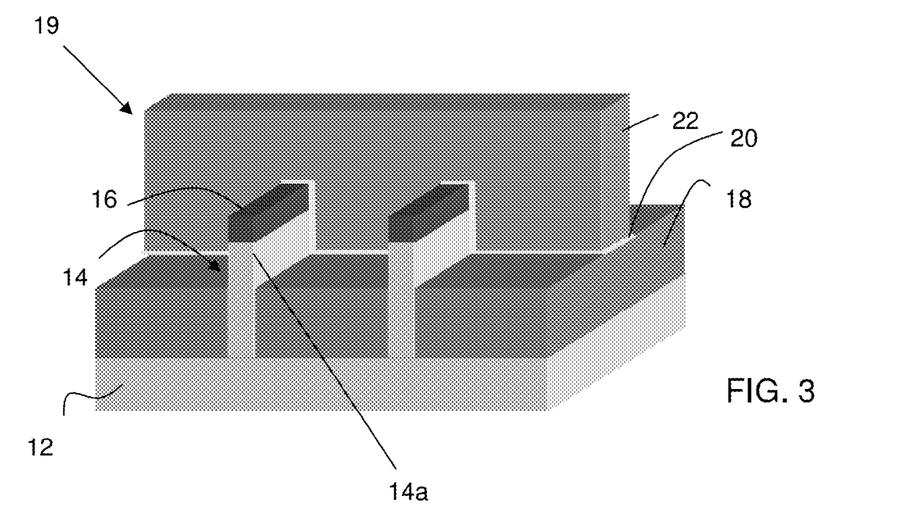

In FIG. 3, a gate structure 19 is formed over the STI regions 18 and the fins 14, e.g., perpendicular to the fins, using conventional processes. For example, in a gate-last process, a dielectric material 20 is deposited over the STI regions 18 and the fins 14, using conventional deposition methods such as, for example, CVD. The dielectric material 20 can be an oxide material, e.g., SiO$_2$. A polysilicon material 22 is then formed over the dielectric material 20, using an atomic layer deposition (ALD) process, for example. The dielectric material 20 and the polysilicon material 22 can then be patterned, for example, using conventional lithography and etching processes, to form the gate structure 19 of FIG. 3.

In alternate embodiments, the gate structure 19 can be formed in a gate-first process. In this example, the dielectric material 20 can be a high-k material such as, for example, a hafnium oxide or other hafnium based material. The thickness of the gate dielectric material 18 can vary depending on the required device performance. The gate material 22 can be any gate metal such as, for example, aluminum lined with a workfunction metal, e.g., TiN or TaN (although other workfunction metals are also contemplated by the present invention).

Figure 4:
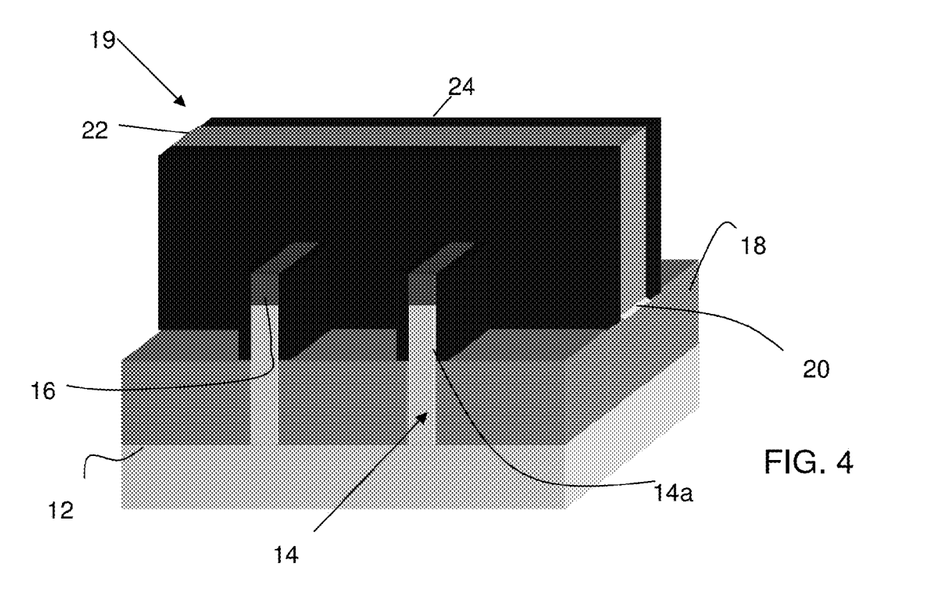

In FIG. 4, a sidewall material 24 is deposited on the gate structure 19, e.g., over the gate material 20. In embodiments, the sidewall material 24 is also formed over the exposed walls 14a of the fins 14. The sidewall material 24 can be a nitride material, deposited to a thickness of about 4 nm to about 12 nm; although other dimensions are also contemplated by the present invention. In embodiments, the nitride material can be deposited using a conventional CVD process, followed by a RIE cleaning process. As should be understood by those of skill in the art, the RIE cleaning process would remove the nitride material from horizontal surfaces, e.g., STI regions 18.

Figure 5:
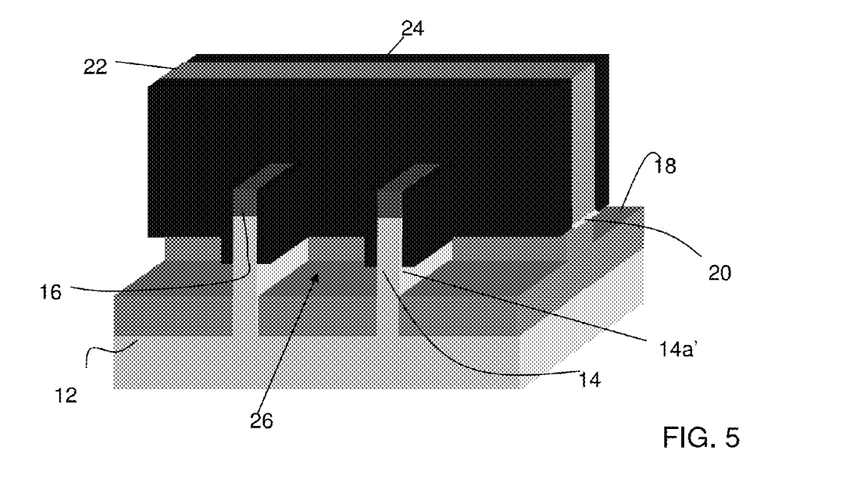

Referring to FIG. 5, the STI regions 18 are recessed, to expose a lower portion 14a' of the fins 14. In embodiments, this recessing step can be performed in a maskless process, using an etchant selective to the material of the STI regions 18, e.g., oxide. In embodiments, an anisotropic etch can first be performed for initial removal of material from the STI regions 18, followed by an isotropic etch to remove the material of the STI regions 18 from the fins 14 to form a recess 26. The latter process, i.e., isotropic etch, will expose the sidewalls 14a' of the fins 14. In embodiments, the STI regions 18 can be recessed about 30 nm; that is, after the etching processes described herein, the exposed sidewalls 14a' of the fins 14 will be about 30 nm (although other dimensions are also contemplated by the present invention).

Figure 6:
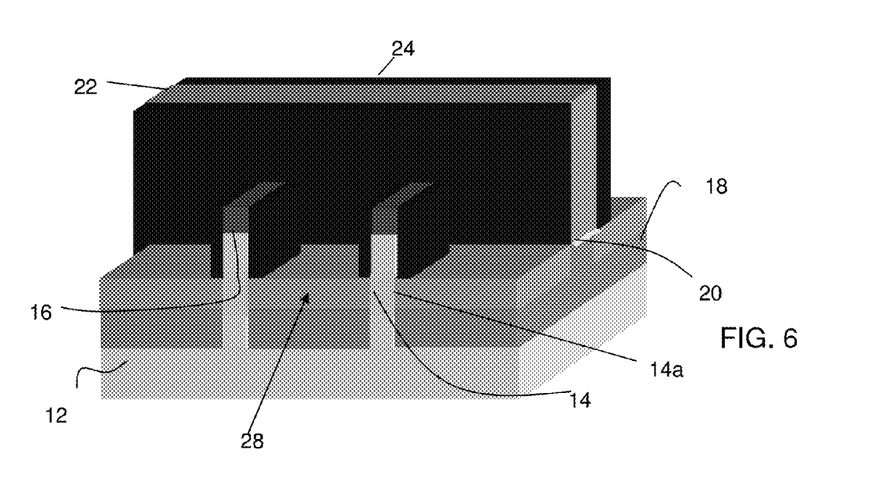

In FIG. 6, a punchthrough stopper 28 is formed by an epitaxial growth process, with in-situ doping. In embodiments, the epitaxial layer will grow on the semiconductor material, e.g., exposed sidewalls 14a' of the fins 14, and will laterally extend over the STI regions 18. As discussed herein, the dopants can vary depending on implementations in an nFET device or pFET device. In embodiments, the epitaxial layer can also be used for strain purposes. For example, SiGe can be used for a pFET and Si:C can be used for an nFET.

More specifically, in a pFET implementation, the epitaxial layer can be a SiGe material with an n-type dopant, e.g., arsenic and/or phosphorous, which will shut off leakage between the source and drain of the device. In an nFET implementation, the epitaxial layer can be a Si:C material with a p-type dopant, e.g., boron, which will also shut off leakage between the source and drain of the device. A thermal anneal can be performed to drive the dopants from the punchthrough stopper 28 and into the fins 14 (see, e.g., FIGS. 9a-9c). In embodiments, the thermal anneal process can be a laser anneal process, rapid thermal anneal process, flash anneal process, furnace anneal process, or other known annealing processes to drive the dopants into the fins 14. Any suitable combination of those anneal processes is also conceived.

Figure 7:
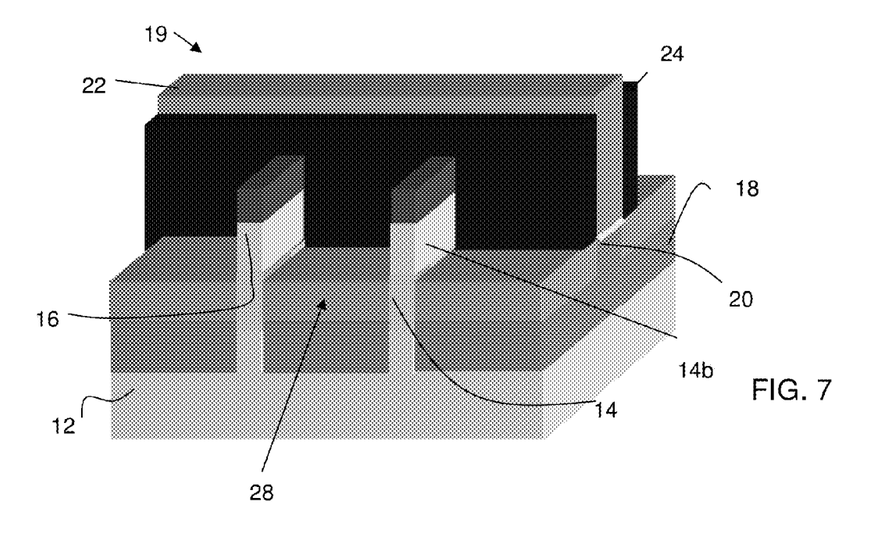

In FIG. 7, the sidewall spacers are removed from the remaining portions of the fins 14. In this process, the removal of the sidewall spacers will expose upper sidewalls 14b of the fins 14. This process will also pull down the sidewalls on the gate structure 19, e.g., the poly material 22 (and may remove some height of the gate material 22). The pull down or removal process can be performed by, for example, a conventional RIE process.

Figure 8:
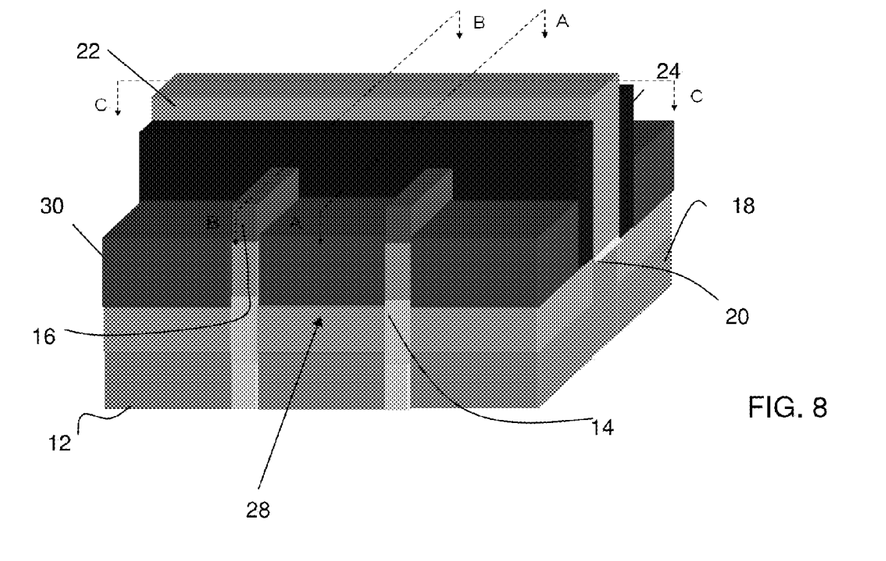

As shown in FIG. 8, an epitaxial layer 30 is formed to create source and drain regions. In embodiments, the epitaxial layer 30 is formed by an epitaxial growth process with in-situ doping. As shown in FIG. 8, this epitaxial process will merge the fins 14, although unmerged fins are also contemplated. In further embodiments, the epitaxial layer 30 can also be used for strain purposes, e.g., SiGe used for straining a pFET and Si:C used for straining an nFET.

More specifically, in a pFET implementation, the epitaxial layer can be a SiGe material with a p-type dopant, e.g., boron. In an nFET implementation, the epitaxial layer can be a Si:C material with an n-type dopant, e.g., arsenic and/or phosphorous. A thermal anneal can be performed to drive the dopants towards the channel to form extensions. In embodiments, the thermal anneal process can be a laser anneal process, rapid thermal anneal process, flash anneal process, furnace anneal process, or other known annealing processes to drive the dopants into the fins 14. Any suitable combination of those anneal processes is also conceived.

Figure 9A:
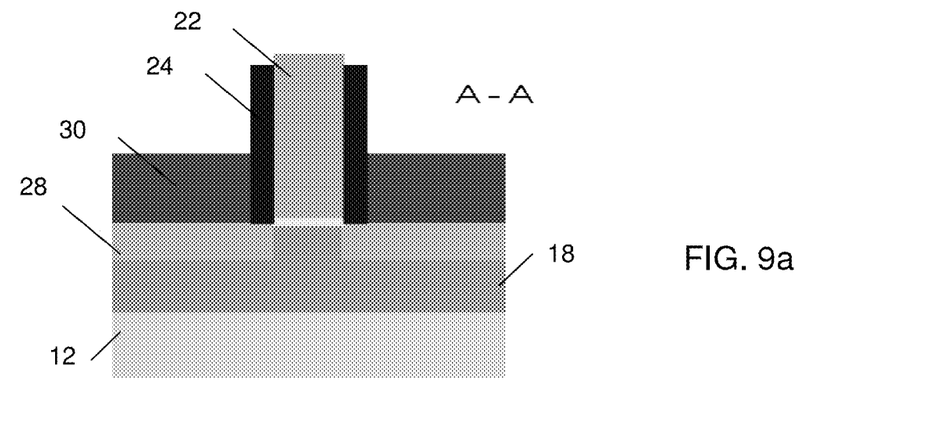

FIG. 9a shows a cross sectional view of FIG. 8, along line A-A. As shown in FIG. 9a, the punchthrough stopper 28 is embedded in STI regions 18 and self-aligned to the gate structure 19. This is accomplished by the annealing process of the punchthrough stopper 28.

Figure 9B:
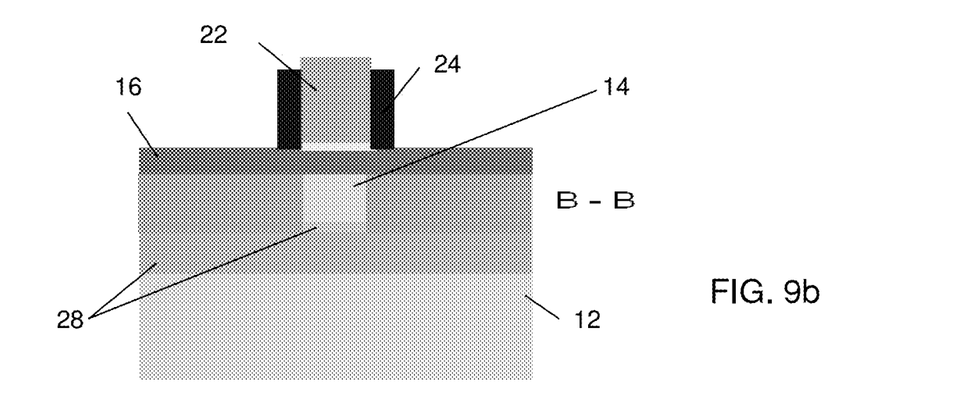
Figure 9C:
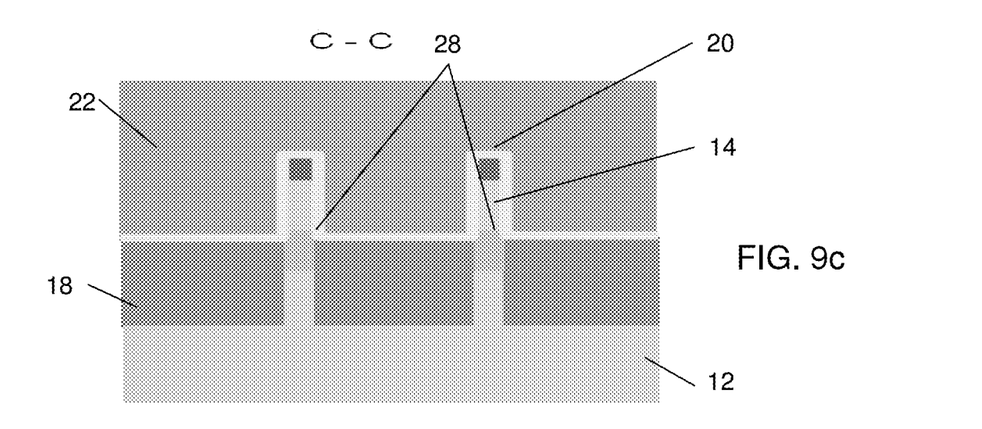

FIG. 9b shows a cross sectional view of FIG. 8, along line B-B, and FIG. 9c shows a cross sectional view of FIG. 8, along line C-C. As shown in FIGS. 9b and 9c, the punchthrough stopper 28 is provided under the fins 14. This is accomplished by diffusing the dopants from the punchthrough stopper 28, during the anneal process.

In alternative processes, as should be understood by those of skill in the art, in a gate-late process, the gate structure 19 can be removed and replaced with a metal gate. In this alternative implementation, the gate structure 19 can be removed by an etching process, e.g., RIE, to form a trench. A dielectric material and gate metal can then be deposited within the trench. For example, a high-k dielectric material, e.g., hafnium based material, can be deposited to form a gate dielectric. A metal liner, e.g., workfunction metal, and a gate metal can then be deposited on the dielectric material to complete the gate formation. In embodiments, the metal liner can be, for example, TiN or TaN; whereas, the gate metal can be aluminum or tungsten.

Figure 10:
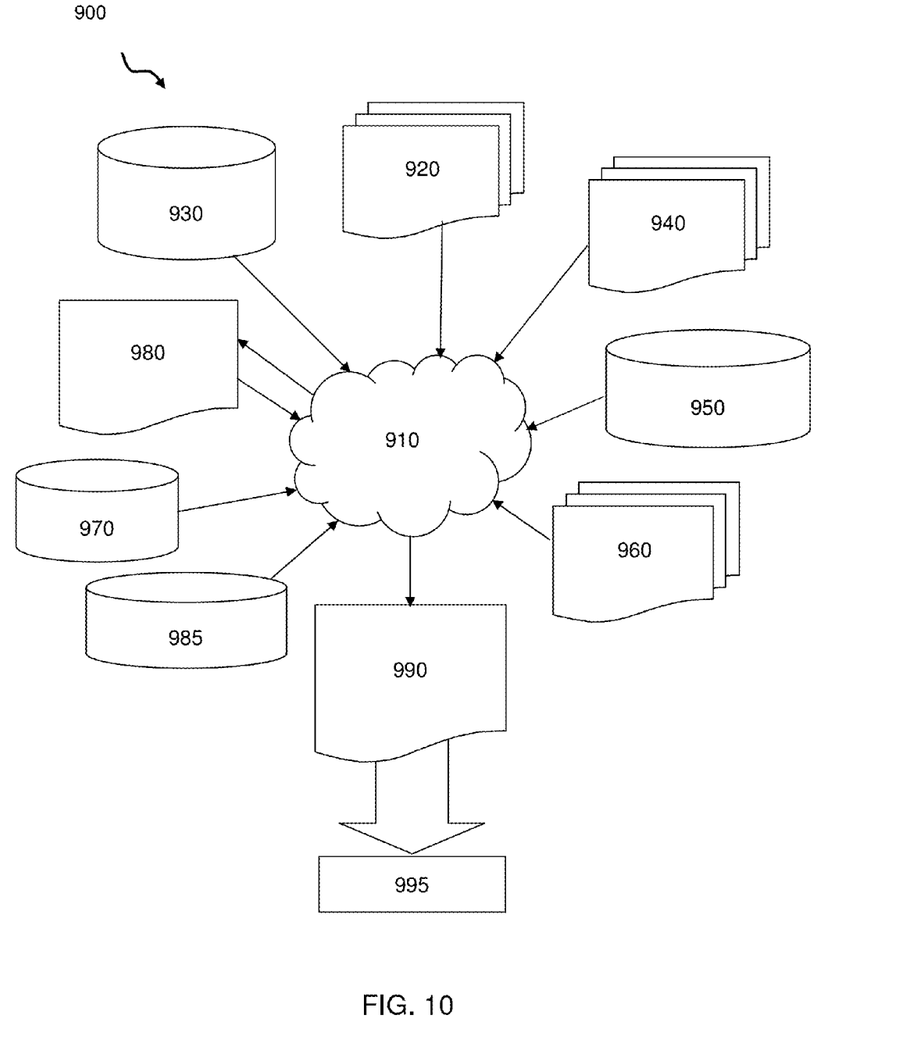
FIG. 10 is a flow diagram of a design process used in semiconductor design, manufacture, and/or test.

FIG. 10 is a flow diagram of a design process used in semiconductor design, manufacture, and/or test. FIG. 10 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-9*c*. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g., e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an Application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 10 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-9*c*. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-9*c* to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in an IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-9c. In one embodiment, design structure 990 may comprise a compiled, executable HDL simulation model that functionally simulates the devices shown in FIGS. 1-9c.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-9c. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method, comprising: forming spacers on sidewalls of a gate structure and fin structures of a finFET device; forming a punchthrough stopper on exposed sidewalls of the fin structures, below the spacers; diffusing dopants from the punchthrough stopper into the fin structures; forming source and drain regions adjacent to the gate structure and the fin structures; removing the spacers of the fin structures which also pulls down the spacers of the gate structure, wherein the exposed sidewalls of the fin structures are formed by recessing of shallow trench isolation (STI) structures after the formation of the gate structure and the fin structures.

2. The method of claim 1, wherein the forming the punchthrough stopper comprises growing epitaxial material on the exposed sidewalls of the fin structures.

3. The method of claim 2, wherein the growing comprises an in-situ doping process.

4. The method of claim 3, wherein the epitaxial material is a strain material.

5. The method of claim 3, wherein the forming the punchthrough stopper further comprises exposing the sidewalls of the fin structures by recessing an underlying shallow trench isolation region, adjacent to the fin structures.

6. The method of claim 1, wherein the diffusing the dopants comprises an annealing process following an in situ deposition process of material forming the punchthrough stopper.

7. The method of claim 1, wherein the spacers are formed by a deposition of nitride material on the sidewalls of the gate structure and the fin structures.

8. The method of claim 7, further comprising removing the spacers from the fin structures, followed by forming the source and drain regions.

9. The method of claim 8, wherein the source and drain regions are formed by an in-situ doping process, followed by an annealing process.

10. The method of claim 1, wherein the fin structures are formed from BULK material.

11. The method of claim 1, wherein the source and drain regions are formed on shallow trench isolation structures which were partially etched to expose the sidewalls of the fin structures, prior to the forming of the punchthrough stoppers.

12. The method of claim 1, wherein the gate structure is formed in a gate-first process.

13. The method of claim 1, wherein the gate structure is formed in a gate-last process.

14. The method of claim 1, wherein: the spacers on sidewalls of the fin structures are formed after the formation of the gate structure; the spacers on sidewalls of the fin structures are of the same material and process as the forming of the spacers of the gate structures; the forming of the punchthrough stopper is formed after the formation of the gate structure; the punchthrough stopper extends laterally over the STI structures between the fin structures; and the punchthrough stopper is an epitaxially grown silicon based material, grown from the exposed sidewalls of the fin structures outward to over the STI structures.

15. A method, comprising:
forming fin structures from at least a BULK substrate;
forming a gate structure on the fin structures and the BULK substrate;
forming shallow trench isolation structures on sidewalls of the fin structures and surfaces of the BULK substrate;
forming sidewall spacers on the sidewalls of the fin structures and sidewalls of the gate structure;
recessing the shallow trench isolation structures to expose sidewalls of the fin structures, below the sidewall spacers after forming of the gate structure;
forming punchthrough stoppers on the exposed sidewalls of the fin structures and the shallow trench isolation structures;
diffusing dopants of the punchthrough stoppers into the fin structures; and
forming source and drain regions over the punchthrough stoppers.

16. The method of claim 15, wherein the forming the punchthrough stoppers comprises growing epitaxial material on the exposed sidewalls of the fin structures with an in-situ doping process.

17. The method of claim 16, wherein the epitaxial material is a strain material.

18. The method of claim 15, wherein the diffusing the dopants comprises an annealing process following an in situ deposition process of material forming the punchthrough stopper.

19. The method of claim 15, wherein the source and drain regions are formed by an in-situ doping process, followed by an annealing process.

20. The method of claim 15, wherein the fin structures are formed from BULK material and the source and drain regions are formed from a doped strain material.

* * * * *